United States Patent [19]

Lao

[11] Patent Number: 4,584,475

[45] Date of Patent: Apr. 22, 1986

[54] SURFACE ACOUSTIC WAVE INFRARED LINE IMAGING ARRAY

[75] Inventor: Binneg Y. Lao, Rancho Palos Verdes, Calif.

[73] Assignee: Allied Corporation, Morris Township, Morris County, N.J.

[21] Appl. No.: 614,584

[22] Filed: May 29, 1984

[51] Int. Cl.⁴ .............................................. H01L 25/08
[52] U.S. Cl. ...................................... 250/332; 350/1.1
[58] Field of Search ............................ 350/1.1; 250/332

[56] References Cited

U.S. PATENT DOCUMENTS

| | | | |
|---|---|---|---|
| 4,072,863 | 2/1978 | Roundy | 250/332 |
| 4,245,330 | 1/1981 | Rebourg | 364/826 |
| 4,388,599 | 6/1983 | Gautier et al. | 333/150 |

OTHER PUBLICATIONS

Spiricon, "Pyroelectric Self-Scanning Infrared Detector Arrays"-Data Sheets.

*Primary Examiner*—Bruce Y. Arnold
*Attorney, Agent, or Firm*—James R. Ignatowski

[57] ABSTRACT

A surface acoustic wave infrared line imaging array having a first interdigital transducer generating a first surface acoustic wave train amplitude modulated by the temperature profile of the substrate in response to a line segment of a received infrared image, a second interdigital transducer generating a parallel reference surface acoustic wave train, equal in amplitude but 180° out of phase with said first surface acoustic wave train, and a third interdigital transducer for summing the amplitudes of said first and reference surface acoustic wave trains to generate a wave train signal in which the individual waves are amplitude modulated in accordance with the intensity profile of the line segment of the infrared image received by the substrate underlying the first interdigital transducer.

22 Claims, 6 Drawing Figures

SURFACE ACOUSTIC WAVE INFRARED LINE IMAGING ARRAY

BACKGROUND OF THE INVENTION

1. Field of the Invention

The invention is related to infrared image detectors and in particular to a surface acoustic wave (SAW) line imaging array.

2. Prior Art

Infrared imaging detectors have a wide variety of commercial and military applications. Currently, most infrared imaging detectors are self-scanned arrays of infrared semiconductor detectors employing solid state charge transfer techniques. However, these self-scanned arrays are relatively expensive and require cryogenics which make them too bulky for many applications, such as intrusion alarms, infrared threat detectors and miniature infrared spectrometers. Pyroelectric imaging detectors operable at room temperature are slow, have poor sensitivity and respond only to time-varying signals. The invention is a monolithic, self-scanned infrared line imaging array which does not require cryogenic cooling, has a fast response, and is sensitive to stationary images.

SUMMARY OF THE INVENTION

The surface acoustic wave infrared line imaging array comprises a first interdigital transducer receiving a line segment of an infrared image for generating a first surface acoustic wave train in response to an impulse signal, a second interdigital transducer, parallel to said first interdigital transducer for generating a second surface acoustic wave train, 180° out of phase with said first surface acoustic wave train, in response to said impulse signal, and a third interdigital transducer disposed proximate the ends of said first and second interdigital transducers for summing the amplitudes of said first and second surface acoustic wave trains to output a wave train signal in which the individual waves are amplitude modulated in accordance with the intensity or profile of the infrared image line segment received by the first interdigital transducer. The amplitude modulated wave train signal may be converted to an analog or digital format.

One advantage of the surface acoustic wave infrared line imaging array is its small size and ease of manufacture. Another advantage is that it does not require cryogenic cooling and is operable at ambient temperatures. Another advantage is its fast response, because the surface acoustic wave samples the surface temperature of the substrate to a depth of only a few microns. These and other advantages will become more apparent from reading the specification in conjunction with the drawings.

DETAILED DESCRIPTION OF THE INVENTION

Figure 1:
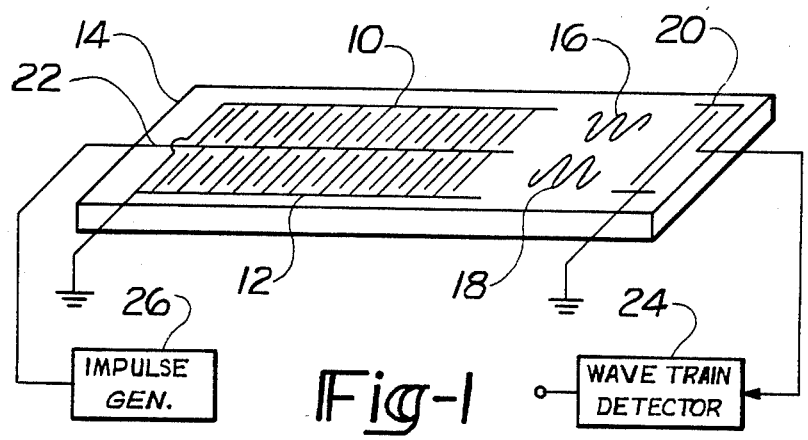
FIG. 1 is perspective of the infrared line imaging array.

The invention is a surface acoustic wave (SAW) pyroelectric infrared line imaging array. Referring to FIG. 1, the infrared line imaging array comprises a pair of side-by-side interdigital transducers 10 and 12 for generating two independant surface acoustic wave trains 16 and 18 which are equal in amplitude but 180° out of phase with each other. An impulse signal generated by impulse generator 26 simultaneously activates interdigital transducers 10 and 12 to generate surface acoustic waves 16 and 18.

The interdigital transducers 10 and 12 are formed on a piezoelectric substrate 14 such as zinc oxide (ZnO), lithium niobate (LiNbO$_3$) or any other temperature sensitive piezoelectric material as in known in the art. The piezoelectric substrate 14 may be a solid substrate as shown, or alternatively may be a piezoelectric layer disposed on a quartz or other crystalline substrate or glass. The structure of the interdigital transducers 10 and 12 may be integrated as shown, having a common connector electrode 22 receiving the impulse signal, or may be two independent interdigital transducers. The length of the interdigital transducers corresponds to the length of an infrared line image segment to be transduced, and will have as many individual pairs of finger elements as required. Each pair of finger elements will constitute an individual pixel or picture element of the infrared line image.

The two independant surface acoustic wave trains 16 and 18 generated by the interdigital transducers 10 and 12 are simultaneously received by a third interdigital transducer 20 disposed proximate the ends of transducers 10 and 12. Interdigital tranducer 20 responds to the two surface acoustic wave trains 16 and 18 and produces an output which is a summation of their instantaneous amplitudes of their individual waves. Wave train detector 24 demodulates the resultant wave train output from transducer 20 and produces an output signal corresponding to the intensity profile of the received infrared line image. The signal from detector 20 may be converted into an analog or digital signal as required by a subsequent utilization device.

Figure 2:
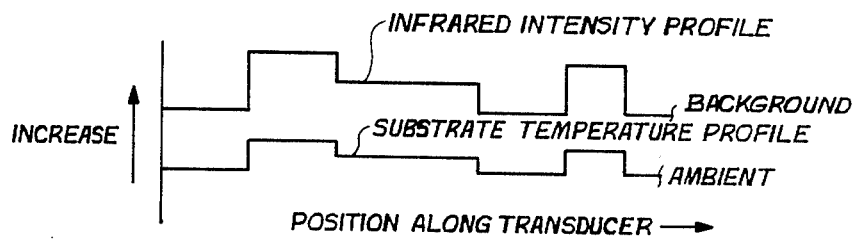
FIG. 2 is a graph showing the correlation between the intensity profile of the line segment of an infrared image and the corresponding temperature profile of the piezoelectric substrate.

In operation, one of the interdigital transducers 10 and 12 is exposed to an infrared line image while the other is not. This may be accomplished by external shielding or optical means well known in the art. The received infrared image will selectively heat the surface of the piezoelectric substrate underlying the one interdigital transducer in accordance with the intensity of the infrared radiation received at each point along its length. The surface of the piezoelectric substrate 14 underlying the one interdigital transducer will therefore have a temperature profile corresponding to the intensity profile of the linear infrared image as shown on FIG. 2.

Figure 3:
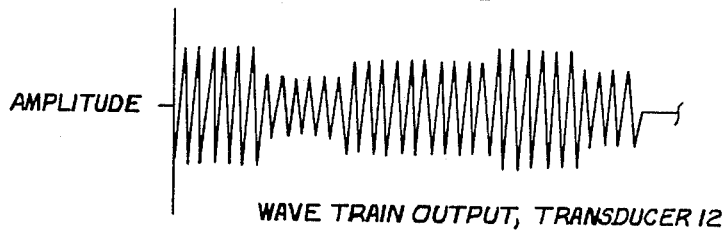
FIG. 3 shows the amplitude modulated surface acoustic wave train resulting from the temperature profile of the substrate.

The surface acoustic wave generation efficiency, that is, the electromechanical coupling coefficient between the finger elements of the interdigital transducer and the piezoelectric substrate is temperature dependent. For typical piezoelectric substrates, such as lithium niobate, the temperature dependent coupling coefficient is approximately 0.1 percent per degree centigrade (0.1%/°C.). Therefore, the coupling coefficient of the individual finger pairs of the interdigital tranducers and the piezoelectric substrate 14 will vary in accordance with the temperature profile of the substrate. Accordingly, the amplitudes of the individual waves of the generated wave train will be amplitude modulated in accordance with the temperature profile of the substrate as shown on FIG. 3.

The surface temperature of the portion of the piezoelectric substrate 14 underlying the other interdigital transducer is not exposed to the linear infrared image and its temperature profile will have a constant value. Therefore the amplitudes of the individual surface acoustic waves of the wave train generated by the other interdigital transducer will be equal.

As previously indicated, interdigital transducers 10 and 12 produce two independent wave trains 16 and 18 which are 180° out of phase with each other. In the absence of an infrared line image, the temperature profiles of piezoelectric substrate underlying both transducers will be identical, the coupling efficiency between the transducers 10 and 12 will be identical, and amplitudes of the corresponding waves of the two generated surface acoustic wave trains will have equal and opposite magnitudes. Therefore in the absence of an infrared image, the wave train output of interdigital transducer 20 in response to surface acoustic waves 16 and 18 will be a null; i.e., having a zero amplitude.

However, when an infrared line image is incident on the surface of the piezoelectric substrate 14 underlying only one of the interdigital transducers, for example interdigital transducer 12, the portion of the piezoelectric substrate 14 underlying transducer 12 will be selectively heated. Since the piezoelectric substrate 14 is a relatively poor thermal conductor, the portion underlying transducer 12 will assume a temperature profile corresponding to the intensity profile of the received infrared line image. This temperature profile will occur on the immediate surface of the piezoelectric substrate and have a depth of only a few microns. As a result, the coupling efficiency between the individual finger elements of the interdigital transducer 12 and the substrate will vary along the length of transducer 12 in accordance with the temperature profile of the underlying substrate. Accordingly, the amplitudes of the individual waves in wave train 18 generated by transducer 12 will vary inversely to the temperature of the substrate underlying the respective finger elements of transducer 12 as shown on FIG. 3. In contrast, the amplitudes of the individual waves of wave train 16 generated by transducer 10 being unaffected by the infrared line image incident on tranducer 12 will all have the same magnitude.

Figure 4:
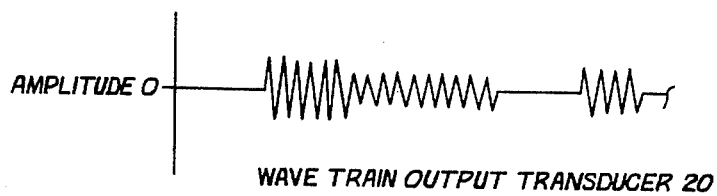
FIG. 4 shows the amplitude modulated wave train output from interdigital transducer 20.

The result of the summation of the two wave trains 16 and 18 by transducer 20 is no longer a null, but will be an amplitude modulated wave train having a frequency corresponding to the frequency of wave trains 16 and 18 as indicated in FIG. 4. The amplitudes of the individual waves output from transducer 20 are modulated according to the temperature profile of the substrate underlying transducer 12, which as previously indicated, corresponds to the intensity profile of the infrared line image.

The amplitude modulated wave train output from transducer 20 may then be detected by wave train detector 24 to produce either an analog signal whose amplitude varies in accordance with the intensity profile of the received infrared line image or may be converted by detector 24 to digital information corresponding to the intensity profile of the infrared line image. The reading rate is determined by length of the line imaging array and the velocity of the surface acoustic wave which is approximately 0.3 centimeters per microsecond.

As is well known in the art, the section of the line imaging array receiving the infrared line image may be coated with an infrared absorbing material (not shown) to enhance the magnitude of the temperature profile of the substrate.

It is recognized that the temperature profile of the substrate will also produce a corresponding phase shift in the surface acoustic wave train generated by the interdigital transducer receiving the infrared line image distorting the resultant wave train output from transducer 20. This distortion may be removed by dedicated electronics in the wave train detector 24 or may be subsequently removed by external processing using known techniques.

Figure 5:
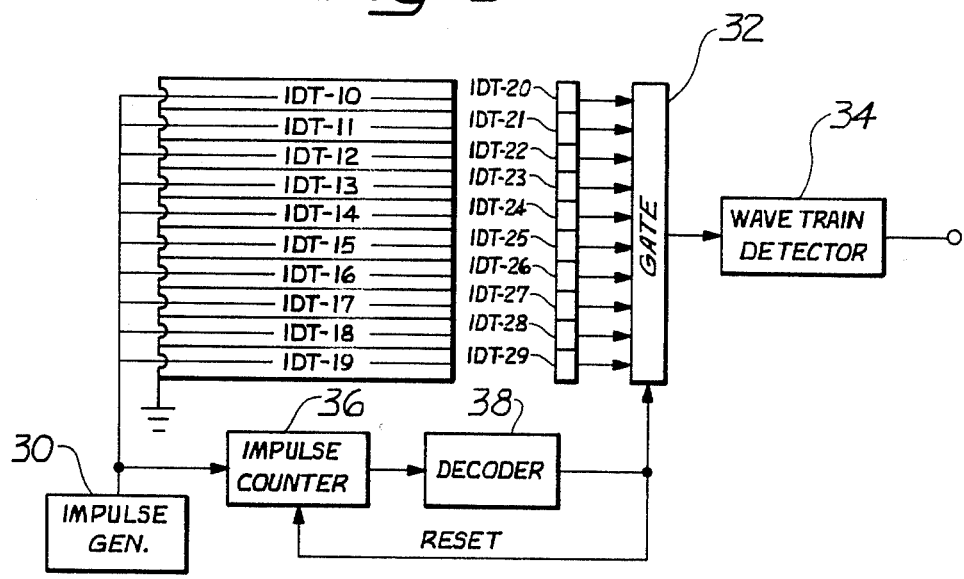
FIG. 5 is a block diagram representation of a two-dimensional array of infrared line imaging arrays.

The line imaging array of FIG. 1 may be expanded to a two dimension infrared imaging array by placing a plurality of line imaging arrays in parallel with each other as shown in FIG. 5. As shown in FIG. 5 the two dimension infrared imaging array comprises a plurality of line imaging arrays identified as IDT-10 through IDT-19. Each of the line imaging arrays IDT-10 through IDT-19 comprises a pair of interdigital tranducers, such as transducers 10 and 12 of FIG. 1, which generate a pair of complementary surface acoustic wave trains which are 180° out of phase with each other as previously described. Associated with each line imaging array is a corresponding interdigital transducer designated IDT-20 through IDT-29 which individually corresponds to transducer 20 of FIG. 1.

The outputs of transducers IDT-20 through IDT-29 are connected to a gate circuit 30 which gates the outputs of transducers IDT-20 through IDT-29, one at a time, to a wave train detector 34 which performs the same function as wave train detector 24 shown on FIG. 1.

The common connector electrodes of the plurality of line imaging array IDT-10 through IDT-19 are connected in parallel to the output of an impulse generator 30. The output of impulse generator 30 is also connected to an impulse counter 36 which generates a number indicative of the number of impulses generated. A decoder 38 responsive to the current number stored in impulse counter 36 produces an output signal which activates gate 32 to transmit the wave trains generated by transducers IDT-20 through IDT-29 one at a time to wave train detector 34 in a predetermined sequence. This sequence may be a consecutive sequence or may be an interlaced sequence such as used in conventional cathode ray image tube (TV type) displays. The output signal indicative of the wave train from the last transducer being transmitted to detector 34 is also fed back to reset impulse counter 36 to begin a new gating sequence of the individual outputs from transducers IDT-20 through IDT-29.

As previously described, only one of the two interdigital transducers of each line imaging array is exposed to the infrared image, and this interdigital transducer may be coated with an infrared absorbing material to enhance its response to the infrared image as previously indicated.

In operation, the impulses to the common connector electrode of each line imaging array are repetitively generated by the impulse generator 30. Each line imaging array produces two individual surface acoustic wave trains, such as wave trains 16 and 18 shown on FIG. 1 which when transduced by transducers IDT-20 to IDT-29 produce amplitude modulated wave trains which correspond to the intensity profile of the corresponding line segment of the infrared image. The first impulse signal is counted in impulse counter 36. The "1" count is decoded by decoder 38 which generates a signal activating gate 32 to transmit the wave train output of transducer IDT-20 to wave train detector 34 where it is converted to an analog or digital signal as required.

The second impulse signal activates the line imaging arrays IDT-10 through 19 to again produce wave trains which are detected by their respective transducers IDT-20 through IDT-29. This second impulse signal indexes impulse counter 86 to the next higher number which is decoded by decoder 38 to activate gate 32 to transmit the amplitude modulated signal of a different transducer to wave train detector 34. If the predetermined readout sequence is sequential, then gate 34 will transmit the output of transducer IDT-21 to wave train detector 34. However, if the predetermined sequence is interlaced, then gate 34 will transmit the output of transducer IDT-22 to wave train detector 34. This procedure continues until outputs from all of the transducers IDT-20 through IDT-29 have been transferred to wave train detector 34 in the predetermined sequence. The output signal of decoder 38, indicative of the last wave train in the sequence being transmitted to the wave train detector 34, also is used to reset impulse counter 36 initializing it for the next sequence.

Those skilled in the art will recognize that the number of line imaging arrays is not limited to the number of line arrays depicted in FIG. 5, but may be fewer or as many as required for the particular application. Also, each transducer IDT-20 through IDT-n may have its own wave train detector 34 as shown on FIG. 1. The output of these individual wave train detectors may then be individually stored or sequentially gated to a utilization or storage device.

Figure 6:
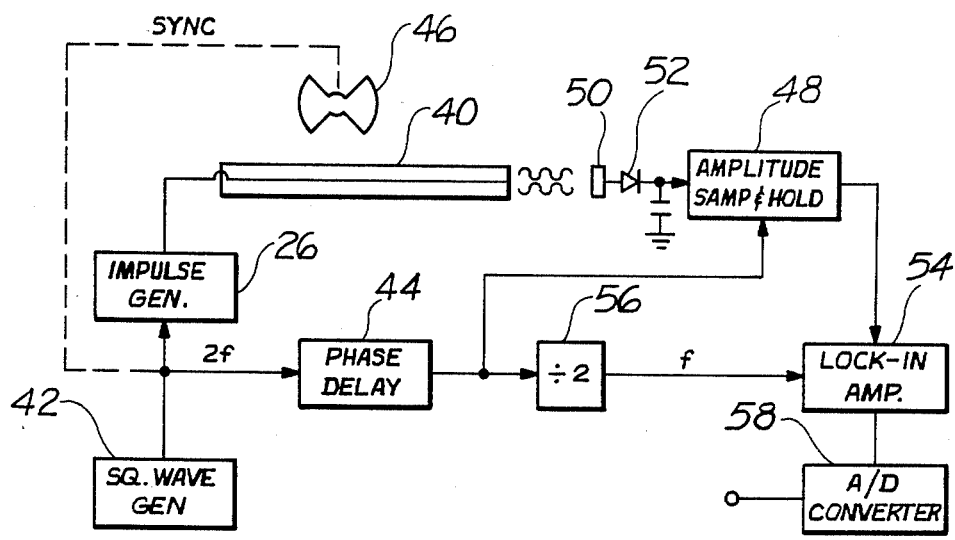
FIG. 6 is a block diagram of a detector generating digital information indicative of the intensity profile of the received infrared image.

The embodiment shown in FIG. 6 shows the details of a wave train detector 24 capable of generating a digital output indicative of the infrared line image. The line imaging array 40 is the same as described with reference to FIG. 1 receiving impulses from an impulse generator 26. The impulse generator 26 is triggered by a square wave generator 42 generating square wave pulses at a frequency $2f$. The output of the square wave generator 42 is also received by a phase delay circuit 44 and a synchronous chopper 46 illustrated as a sectored disc. Synchronous chopper 46 chops the incoming infrared signal at a frequency "f" so that the incoming infrared signal modulates every other pair of surface acoustic wave trains generated by the line imaging array 40. The phase delay circuit 44 progressively delays the square wave signal and applies delayed square wave signal to an amplitude sample and hold circuit 48 and a divide-by-two ($\div 2$) circuit 56.

The two wave trains generated by the line imaging array 40 are summed by interdigital transducer 50 which corresponds to interdigital transducer 20 of FIG. 1 and generates an amplitude modulated wave train as previously described. The amplitude modulated wave train is received by the amplitude sample and hold circuit 48 through diode 52. The amplitude sample and hold circuit 48 is triggered to sample and hold each wave in the amplitude modulated wave train, one at a time in a sequential order. The sequencing is achieved by gradually increasing the phase delay in phase delay circuit 44. Th amplitude sample and hold circuit 48 is triggered to sample in response to the leading edge of the delayed square wave received from phase delay circuit 44.

The output of the amplitude sample and hold circuit 48 is connected to a lock-in amplifier 54 which amplifies and temporarily stores the value of amplitude of the sampled wave in synchronization with the output of the divide-by-two circuit 56. The output of the lock-in amplifier 54 is connected to an analog-to-digital converter 58 which converts the amplitude of the sampled wave to a digital format. As previously indicated, the phase delay circuit 44 progressively delays the square wave generated by the square wave generator 42 so that amplitude of each wave in the amplitude modulated wave train is sequentially sampled and converted to a digital format. The phase delay circuit 44 thus enables one to scan detect each pixel element of the line array 40 in sequence across the line image. The output of the divide-by-two circuit 56 is synchronized with the chopper 46 so that the lock-in amplifier 54 looks at the difference between the amplitude of the wave generated for a given pixel element when exposed and not exposed to the infrared line image. The fixed pattern noise inherent in the line array 40 is thus eleminated. When the fixed pattern noise is not a problem, the chopper 46, divide-by-two circuit 56 and lock-in amplifier 54 may be eliminated and the A/D converter 58 receives the output of the sample and hold circuit 48.

It is not intended that the invention be limited to the embodiments shown on the drawing and discussed in the specification. It is recognized that a person skilled in the art will be able to make changes or improvements to the line array infrared detector disclosed herein as set forth in the appended claims.

What is claimed is:

1. A surface acoustic wave line imaging array for converting a received infrared image to corresponding electrical signals comprising:
   a first interdigital transducer receiving a line segment of an infrared image for generating a first surface acoustic wave train in response to an impulse signal;
   a second interdigital transducer parallel to said first interdigital transducer for generating a second (reference) surface acoustic wave train in response to said impulse signal, said second interdigital transducer not receiving said infrared image line segment and positioned so that said second surface acoustic wave has the same amplitude but is 180° out of phase with said first surface acoustic wave; and
   a third interdigital transducer disposed proximate the ends of said first and second interdigital transducers for summing said first and second surface acoustic waves to generate an amplitude modulated wave train signal whose individual waves are modulated in accordance with the intensity profile of the infrared image line segment received by said first interdigital transducer.

2. The line imaging array of claim 1 wherein said first, second and third interdigital transducers are disposed on a common piezoelectric substrate having a temperature dependent surface acoustic wave coupling efficiency.

3. The line imaging array of claim 2 wherein said first and second interdigital arrays have at least one common electrode receiving said impulse signal.

4. The line imaging array of claim 3, wherein said first and second interdigital transducers have equal numbers of finger pairs equally spaced along the surface of said substrate.

5. The line imaging array of claim 4 further including means for demodulating said amplitude modulated wave train signal to generate an analog signal.

6. The line imaging array of claim 4 further including means for converting said amplitude modulated wave train signal to digital information.

7. An infrared line imaging array comprising a piezoelectric substrate having a temperature dependent surface acoustic wave coupling efficiency:
   impulse generator means for generating an impulse signal;
   first interdigital transducer means disposed on said piezoelectric substrate for generating a first surface acoustic wave train in response to said impulse signal;
   second interdigital transducer means disposed on said piezoelectric substrate for generating a second surface acoustic wave train in response to said impulse signal, said second surface acoustic wave train having the same amplitude but being 180° out of phase with said first surface acoustic wave train;
   third interdigital transducer means disposed on said piezoelectric substrate for summing said first and second surface acoustic wave trains to generate an amplitude modulated wave train; and
   means for isolating a received infrared image to illuminate one of said first and second interdigital transducer means to amplitude modulate the surface acoustic wave train generated by said one interdigital transducer means.

8. The infrared line imaging array of claim 7 wherein said first and second interdigital transducer means have a common electrode receiving said impulse signal.

9. The infrared line imaging array of claim 8 wherein each of said first and second interdigital transducer means has a plurality of identical equally spaced finger pairs.

10. The infrared line imaging array of claim 7 wherein said received infrared image illuminating said one interdigital transducer means has an intensity profile, said infrared line imaging array further including detector means for generating an analog signal indicative of said intensity profile in response to said amplitude modulated wave train.

11. The infrared line imaging array of claim 7 wherein said received infrared image illuminating said one interdigital transducer means has an intensity profile, said line imaging array further including detector means for generating digital information indicative of said intensity profile in response to said amplitude modulated surface acoustic wave.

12. The infrared line imaging array of claim 7 further including a plurality of said first, second and third interdigital transducer means disposed parallel to each other.

13. The infrared line imaging array of claim 12 further comprising:
   detector means for demodulating said amplitude modulated wave train to generate an analog signal; and
   gate means for transmitting said amplitude modulated wave trains generated by said plurality of third interdigital transducer means to said detector means, one at a time, in a predetermined sequence in response to a signal indicative of said impulse signal.

14. The infrared line imaging array of claim 12 further comprising:
   detector means for converting said amplitude modulated wave trains to digital information; and
   gate means for transmitting said amplitude modulated wave trains generated by said plurality of third interdigital transducer means to said detector means, one at a time in a predetermined sequence in response to a signal indicative of said impulse signal.

15. A two dimensional imaging array for converting an infrared image to electrical signals, comprising:
   a plurality of surface acoustic wave line imaging arrays disposed in parallel relationship, each of said surface acoustic wave line imaging arrays generating an amplitude modulated wave train in response to an infrared image;
   gate means connected to said plurality of surface acoustic line imaging arrays for outputting said plurality of amplitude modulated wave trains one at a time in a predetermined sequence;
   wherein each of said surface acoustic wave line imaging arrays comprises
   a first interdigital transducer responsive to a line segment of said infrared image for generating a first surface acoustic wave train in response to an impulse signal, said first acoustic wave train modulated in accordance with the intensity profile of said line segment of said infrared image;
   a second interdigital transducer parallel to said first interdigital transducer for generating a second surface acoustic wave train in response to said impulse signal, said second surface acoustic wave train having an equal amplitude but being 180° out of phase with said first surface acoustic wave train; and
   a third interdigital transducer disposed proximate the ends of said first and second interdigital tranducers for summing said first and second surface acoustic waves to generate said amplitude modulated wave train.

16. The two dimensional array of claim 15 wherein said plurality of line imaging arrays are disposed on a common piezoelectric substrate having a temperature dependent coupling efficiency.

17. The two dimensional array of claim 15 wherein each of said line imaging arrays has an electrode common to said first and second interdigital transducers.

18. The two dimensional array of claim 17 wherein said common electrodes are connected in parallel and receive said impulse signal.

19. The two dimensional array of claim 15 having wave train detector means connected to the output of said gate for converting said amplitude modulated wave trains to analog signals.

20. The two dimensional array of claim 19 wherein said predetermined sequence is a linear sequence.

21. The two dimensional array of claim 19 wherein said predetermined sequence is an interlaced sequence.

22. The two dimensional array of claim 15 having wave train detector means connected to the output of said gate for converting said amplitude modulated wave trains to digital information.

* * * * *